United States Patent [19]
Rosenberg et al.

[11] Patent Number: 6,141,788
[45] Date of Patent: Oct. 31, 2000

[54] METHOD AND APPARATUS FOR FORWARD ERROR CORRECTION IN PACKET NETWORKS

[75] Inventors: Jonathan David Rosenberg, Freehold; Henning Gunther Schulszrinne, Leonia, both of N.J.

[73] Assignee: Lucent Technologies Inc., Murray Hill, N.J.

[21] Appl. No.: 09/170,596

[22] Filed: Oct. 13, 1998

Related U.S. Application Data

[60] Provisional application No. 60/077,991, Mar. 13, 1998.

[51] Int. Cl.[7] .......................... H03M 13/11; H03M 13/35
[52] U.S. Cl. .............................. 714/774; 714/776
[58] Field of Search .................... 714/746, 774, 714/776

[56] References Cited

U.S. PATENT DOCUMENTS

| | | | |
|---|---|---|---|
| 5,600,663 | 2/1997 | Ayanoglu et al. | 371/41 |
| 5,699,369 | 12/1997 | Guha | 371/41 |
| 5,724,345 | 3/1998 | Guarneri et al. | 370/316 |
| 5,883,891 | 3/1999 | Williams et al. | 370/356 |
| 5,917,835 | 6/1999 | Barrett et al. | 371/37.4 |
| 5,936,949 | 8/1999 | Pasternak et al. | 370/328 |
| 6,012,159 | 1/2000 | Fischer et al. | 714/755 |

OTHER PUBLICATIONS

C. Perkins et al., *RTP Payload for Reduncant Audio Data*, pp. 1–10, Sep., 1997, Network Working Group,Request for Comments (RFC) 2198, Category: Standards Track, at ftp://ftp.isi.edu/in–notes/rfc2198.txt.

C. Perkins, Options for Repair of Streaming Media, pp. 1–12, Jun., 1998, Internet Draft. Internet Engineering Force, RFC 2354.

J. C. Bolot et al., *The case for fec–based error control for packet audio in the internet*, 21 pages in 10 parts, Multi–media Systems, Jan., 19, 1997.

D. Budge et al., *Media–independent Error Correction Using RTP*, pp. 1–16, May, 1997, Internet Draft, Internet Engineering Task Force.

H. Schulzrinne et al., *RTP: A Transport Protocol for Real–Time Applications*, pp. 1–63, Jan., 1996, an internet standard (RFC 1889).

H. Schulzrinne et al., *RTP Profile for Audio and Video Conferences with Minimal Control*, pp. 1–17, Jan., 1996, Network Working Group (proposed standard) (RFC 1890).

J. Rosenberg et al., *An RTP Payload Format for Generic Forward Error Correction*, pp. 1–15, Mar. 9, 1998, Internet Draft, Internet Engineering Task Force, Work in progress.

*Primary Examiner*—Stephen M. Baker
*Attorney, Agent, or Firm*—Wilford L. Wisner

[57] ABSTRACT

A method for applying forward error correction in a transmission network includes the steps of choosing one of a plurality of possible error correction codes, using an appropriate field to encode a complete forward-error-correcting (FEC) code algorithm in each FEC packet to be transmitted. The packet stream, consisting of media packets and FEC packets can be sent to both FEC-capable and FEC-incapable receivers. Decoding methods are independent of the forward-error-correcting code transmitted. The sender can adapt the forward-error-correction code algorithm and the degree of error correction provided on a one-time basis or even more dynamically. Decoding and recovery at the receiver require no prior notification from the sender. Applying the FEC code algorithm to decode includes interrogating the bits in an offset bit mask in each FEC packet to yield links with media packets, and applying other fields of the FEC header to obtain instructions to recover lost data in one of the media packets. Based thereon, reiterative decoding of media packets ensures that lost data recoverable with combinations of media packets and FEC packets are recovered.

13 Claims, 2 Drawing Sheets

METHOD AND APPARATUS FOR FORWARD ERROR CORRECTION IN PACKET NETWORKS

CROSS-REFERENCES TO RELATED APPLICATIONS

This application claims the benefit of U.S. Provisional Application Ser. No. 60/077,991, filed Mar. 13, 1998.

FIELD OF THE INVENTION

This invention relates to correction of errors, such as packet loss, in transmission networks of the packet network type and, particularly, to methods and apparatus for forward correction of errors in connectionless networks.

BACKGROUND OF THE INVENTION

Connectionless networks, such as the Internet, often suffer from large amounts of packet loss. Such loss is extremely troublesome for real time applications, such as voice and video, especially on wide-area transmissions. These applications are delay sensitive, and therefore can not afford to retransmit lost data. Furthermore, loss conditions on the connectionless network may vary, even during the duration of a single session. To compensate for these conditions, traditional forward error correcting codes (FEC) have been proposed for use on packet networks, including the Internet. Typically, these codes are statically determined and signaled out of band, so that the code in use cannot be changed easily during the duration of one transmission from a user. Furthermore, when the media in use are of the multicast or broadcast types, out-of-band signaling is often not possible and the FEC code is not changed. The use of a static FEC code provides too much transmitted error-correcting code when loss rates are low and thus wastes bandwidth and provides too little transmitted error-correcting code and resulting poor reception quality when loss rates are high.

Nevertheless, conventional practice is to use a single FEC code, signaled once, out of band. Recently, in-band signaling in a more dynamic application has been proposed for multicast. The changing of codes would, however, be quite restricted to a small set of predetermined codes. A further drawback is that all recipients would be required to understand FEC encoding and its algorithm. In multicast groups, this is an unreasonable expectation. Thus, more versatile and effective error correction is needed for transmission networks and especially for connectionless network applications.

SUMMARY OF THE INVENTION

According to a first aspect of the invention, a method for applying forward error correction in a transmission network includes the steps of choosing one of a plurality of possible error correction codes, using an appropriate field to encode a complete forward-error-correcting (FEC) code algorithm in each FEC packet to be transmitted. Advantageously, the packet stream, consisting of media packets and FEC packets can be sent to both FEC-capable and FEC-incapable receivers. In a specific implementation of the method of the invention, a decoding method is employed that is independent of the forward-error-correcting code transmitted.

According to a second aspect of the invention, apparatus for applying forward error correction in a transmission network implements the method.

BRIEF DESCRIPTION OF THE DRAWING

Further features and advantages according to both aspects of the invention will become apparent from the following detailed description, taken together with the drawing, in which.

DETAILED DESCRIPTION

Figure 1:
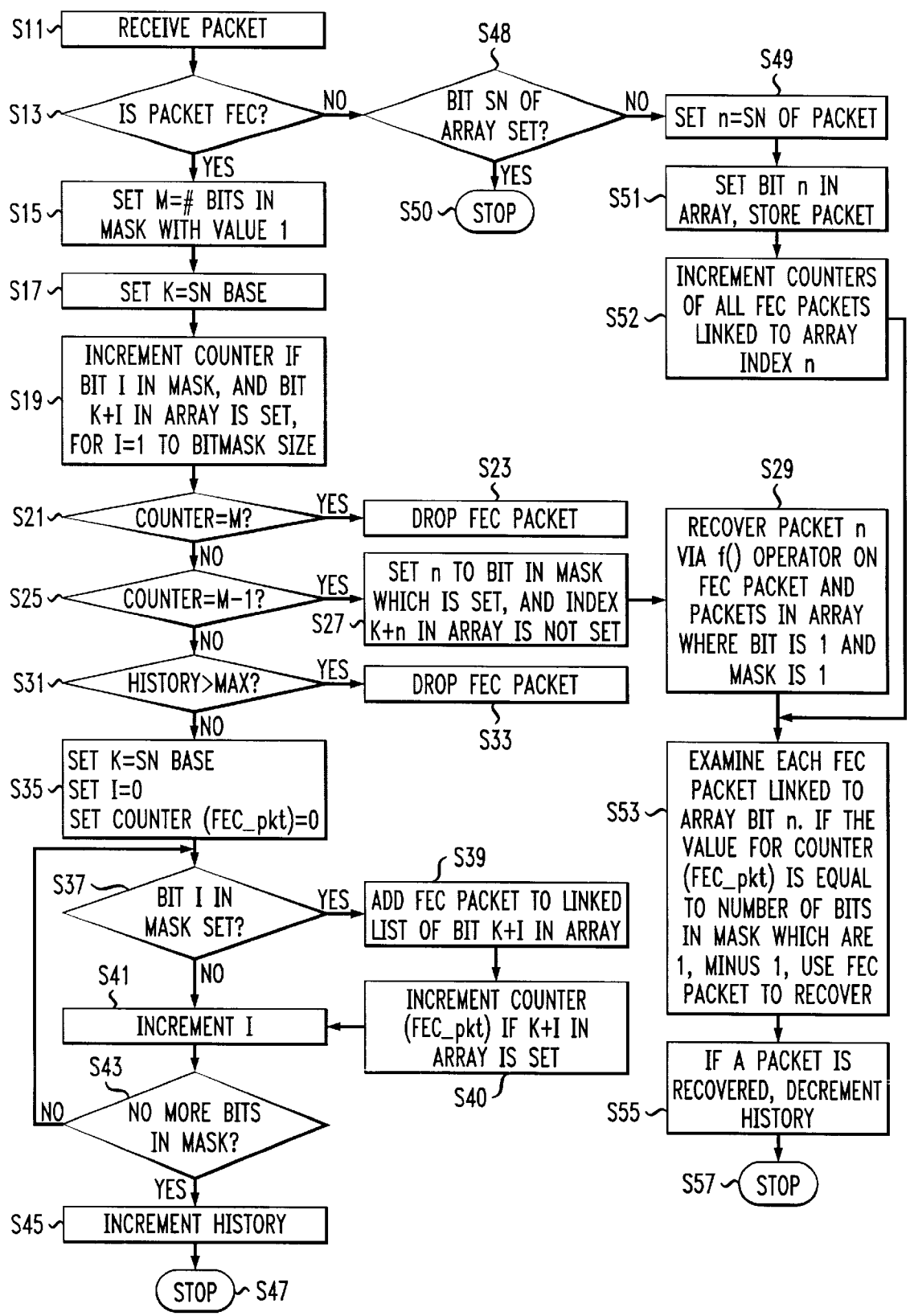
FIG. 1 is a flow chart of a preferred implementation of the method of the invention.

The aim of the method of the invention, to be described primarily with reference to FIG. 1, is to generalize the format for forward error protection so that the sender can adapt the forward-error-correction code algorithm and the degree of error correction provided on a one-time basis or even more dynamically. Moreover, while media packet streams and FEC code packet streams are effectively juxtaposed, no particular degree of interleaving is required. The degree of overhead imposed is variable, dependent upon the degree of error-correction currently being provided. Capability exchanges are avoided, simplifying the protocol and eliminating compatibility problems.

Before the protocol is described, the following terms are described for clarity. A media payload is a piece of raw, unprotected user data. A media header is the real-time transmission protocol (RTP) header for the media payload. The combination of a media payload and the media header is called a media packet. The forward-error-correction algorithms at the transmitter take the media packets as an input. They output both the media packets as they are passed and new packets called FEC packets. The FEC packet contains an FEC header and FEC payload. Each FEC packet is said to be associated with one or more media packets when those media packets are used to generate the FEC packet. The preferred implementation of the invention uses the Exclusive OR (hereinafter, xor) operation to generate the FEC packets.

In the preferred implementation, the FEC packets are sent as a separate stream from the media packets. By this, we mean that the FEC packets have their own sequence-number-and-timestamp space. This mode is illustratively implemented in a manner that allows the two packet streams to be sent by separate multicast groups. Advantageously, receivers that are not FEC-capable can easily ignore the FEC packets and just receive the original media packets. Sequence numbers and timestamps are then coherent for each packet stream.

More broadly, however, the separate stream concept is adaptable to being defined by a particular application and high-level protocol. For multicast, the separate streams may be implemented by separate multicast groups, by different ports in the same group, or by a different Synchronization Source (SSRC) value within the same group or port. For unicast, different ports or different SSRC may be used. Each of these several implementations will have both advantages and, possibly, drawbacks dependent on the application. At the receiver, arriving FEC and media packets are used to generate a stream of media packets for direct use by the application. Error protection is cleanly separated from the application.

The protocol operates by encompassing error protection algorithms that work by applying some function $\underline{f}$ to one or more media payloads, which are specified as the arguments to $\underline{f}$. The result of applying this function is an FEC payload. When the function is applied to just a single media payload, the result is that media payload. Thus, $\underline{f}(a)=a$. In contrast, when the function is applied to multiple media payloads, the result is some combination of those payloads. Preferably, $\underline{f}$ can combine any number of payloads, each with arbitrary lengths. Recovery is possible if a sufficient number of FEC and media packets are received. Sufficiency depends on the reception of N packets (media or FEC) that contain linearly independent combinations of at most N media packets. In the preferred implementation the function f is the Exclusive OR (xor), defined as:

f(a,b,c)=a xor b xor c.

For example, consider further the use of the xor. Media packets w,x,y, and z, with media payloads a, b, c, and d are to be transmitted. Pairs of media payloads will be xor'ed together to generate the FEC payloads. The resulting network packet stream is denoted as:

a, b, f (a,b), c, d, f (c,d).

In this example, the error correction scheme introduces a 50% overhead. But if b is lost a and f (a,b) can be used to recover b. The ways in which the various implementations would differ will appear in the set of media payloads over which the xor (or, more generally, f()) is applied, and the order in which the resulting packets are sent.

In any forward-error-correcting code arrangement, as well as those of the present invention, it is necessary for the receiver to know the function being applied and to know the set of media payloads to which the function is to be applied. At the receiver, only the FEC packets convey the function f(), according to the present invention. Specifically, the payload type in the FEC packet header is set to give the function f.

To determine which packets are associated with an FEC packet, according to the present invention, a field called the offset mask is present in the FEC packet header. Assume this mask is M bits. If bit k in the mask is set to 1, then the media packet with sequence number N+k is associated with this FEC packet, where N is the sequence number base in the FEC packet header. This effectively allows an FEC packet to be associated with any of the M packets before or after it. The offset mask and the FEC payload type provide sufficient indicators for arbitrarily large or complex forward-error-correcting code algorithms.

When a packet is to be transmitted that contains FEC data, i.e., its payload is derived from one or more media payloads, the RTP header is followed by an FEC header. In the RTP header fields, the version field is set to 2. The padding bit is computed via the protection operation, defined below. The extension bit is also computed via the protection operation. The Synchronization Source (SSRC) value should generally be the same as SSRC value of the media stream it protects. Each SSRC value is an identifier chosen by each respective RTP session participant. The SSRC value of the FEC packet may be different from that of the media stream if the FEC stream is being multiplexed via the SSRC value. The number of users in a Contributing (CSRC) List of SSRC values is computed via the protection operation. That number of users is called the CSRC count field (CC). The CSRC list itself is never present, independent of the value of the CC field. The extension is never present, independent of the value of the X bit. The marked bit is computed via the protection operation. The sequence number has the standard definition. It is one higher than the sequence number in the previously transmitted FEC packet.

The timestamp is set to the value of the media (RTP) clock at the time of generation of the FEC packet. This setting allows the timestamps of sequential FEC packets to usually increment, although timestamp behavior for different FEC schemes will vary. The payload type for the FEC packet is set as described above. End systems that cannot recognize a payload type must discard the FEC packet in any case. This fact and the fact that no media packets are discarded provide compatibility with older systems. The FEC mechanisms according to the invention can be used in a multicast system with mixed FEC-capable and FEC-incapable receivers. Following the RTP header is the FEC header. This header is nominally 64 bits, and may optionally be extended to 96 bits, The format of the header is as follows:

```
+_+_+_+_+_+_+_+_+_+_+_+_+_+_+_+_+_+_+_+_+_+_+_+_+
| length recovery | E | PT recovery | TS recovery |
+_+_+_+_+_+_+_+_+_+_+_+_+_+_+_+_+_+_+_+_+_+_+_+_+
| SN Base | mask |
+=+=+=+=+=+=+=+=+=+=+=+=+=+=+=+=+=+=+=+=+=+=+=+=
| Additional Offset Mask |
+_+_+_+_+_+_+_+_+_+_+_+_+_+_+_+_+_+_+_+_+_+_+_+_+
```

The length recovery field is used to determine the length of any recovered packets. It is computed via the protection operation applied to the 16 bit natural binary representation of the lengths in bytes of the media payload, CSRC list, and extension and packing of media packets associated with this FEC packet. In other words, the CSRC list, extension, and padding, if present, are counted as part of the payload. This arrangement allows the FEC procedure to be applied even when the lengths of the media packets are not identical. For example, assume an FEC packet is being generated by xor'ing two media packets together. If, for example, the lengths of the two media packets are 3(0b011) and 5(0b101) bytes, respectively, the length recovery field is then encoded as 0b011 xor 0b0101=0b110.

The E bit indicates a header extension. When set to 1, it indicates that an additional 32 bits of header follow.

The PT recovery field is obtained via the protection operation applied to the payload types of the media packets associated with the FEC packet.

The mask field is either 16 bits or 48 bits, depending on the value of E. If the bit k in the mask is set to 1, then the media packet with sequence number N+k is associated with this FEC packet, where N is the SN Base field in the FEC packet header. The SN base field is always set to the minimum sequence number of those media packets protected by FEC. This setting allows for the FEC operation to extend over any string of at most 16 packets, whose range in sequence numbers is no more than 16.

The TS recovery field is computed via the protection operation applied to the least significant 8 bits of the timestamps of the media packets associated with this FEC packet. In this way, the high-frequency component of the timestamp is recovered via FEC, while the low-frequency component can be determined by interpolation.

The payload of the FEC packet is the protection operation applied to the to the CSRC list plus payloads of the media packets associated with the FEC packet.

The protection operation involves taking a variety of fields from the various headers, adding the payloads, appending the whole thing together, padding zeroes, and then computing the f() operator across the whole binary array. The result is then placed into the FEC packet for transmission.

For each media packet to be protected, a binary array is generated by appending the following fields together:

1. Padding bit (1 bit)
2. Extension bit (1 bit)
3. CC bits (3 bits)

4. Marker bit (1 bit)
5. Payload type (7 bits)
6. Least significant 8 bits of Timestamp (8 bits)
7. Natural binary representation of the length of the CSRC List plus padding plus payload plus extension of the media packet (16 bits)
8. CSRC List (if CC is 1), else null (variable)
9. Header extension, if X is 1, else null
10. The payload (variable)
11. Padding, if present (variable)—if the lengths of the binary arrays are not equal, arrays padded with zeroes to be the length of the longest binary array The preceding steps describe the generation of one binary array.

The f0 operator is then applied across the binary arrays. The result is the binary array of the FEC packet. The first bit in the FEC packet binary array is written into the Padding Bit of the FEC packet. The second bit in the FEC packet binary array is written into the Extension Bit of the FEC packet. The next three bits of the FEC packet binary array are written into the CC field of the FEC packet. The next bit of the FEC packet binary array is written into the marker bit of the FEC packet. The next seven bits of the FEC packet binary array are written into the PT recovery filed in the FEC packet header. The next eight bits of the FEC packet binary array are written into the TS recovery field in the packet header. The next 16 bits are written into the Length Recovery field in the FEC packet header. The remaining bits are set to be the payload of the FEC packet. Each such FEC packet is then transmitted in the connectionless network such as the Internet or other packet network.

Reception and decoding at the receiver are described in the following. The FEC packets allow end systems to recover from the loss of media packets. All of the header fields of the missing packets, including CSRC lists, extensions, padding bits, and marker and payload types, are recoverable.

The reception process will be described with reference to FIG. 1. The steps of FIG. 1 are executed by one or more central processing units in a receiver equipped to use the invention.

In step S11 a packet is received at the receiver. In step S13, the received packet is tested to determine if it is an FEC packet, i.e., tested to detect the presence of a bitmask. If "Yes", step S15 sets M to the number of bits with value 1 in the bitmask. Step S17 sets K=SN, the sequence number base, where K is the current minimum sequence number of those media packets protected by FEC.

Step S19 increments a counter if bit I in the bit mask is set and bit K+I in the array is set, for I=1 to the size of the bitmask.

Step S21 checks to see if the counter setting is M. If "yes", step S23 drops the FEC packet. If "no", step S25 checks to see if the counter setting is M−1. If "yes", step S27 sets n equal to the index of the bit in the mask which bit is set, but for which n the bit K+n in the array is not set. Step S29 recovers a packet n via f0 operator on FEC packet together with packets in the array where bit is 1 and mask is 1.

The recovery procedure of step S29 is set forth in more detail below.

Further with respect to step S25, if the counter setting is not equal to M−1, step S31 checks whether the history is greater than maximum. If "yes", step S33 drops the FEC packet. If "no", step S35 sets K=the sequence number base, sets the FEC packet counter to 0, and sets I=0.

Processing then continues in this line. Step S37 checks to see if bit I in the bitmask is set. If "yes", in step S39 the FEC packet is added to the linked list of bit K+I in the array. If "no", the value i of I is incremented in step S41. Further, after step S39, step S40 increments the FEC packet counter if K+I in the array is set and redirects processing to step S41. After step S41, step S43 checks to see if there are no more bits in the bitmask. If "yes" (There are no more bits in the bitmask), step S45 increments the history and proceeds to Stop, step S47. If "no" (There are more bits in the bitmask), processing return to step S37 to check whether bit I, now on a new value I, in the bitmask is set.

Consider now the other branch of the method at step S13. If the received packet is not an FEC packet, then it must be a media packet. Step S48 checks whether bit SN of the array is set. If "yes", Step S50 stops processing. If "no", Step S49 sets n=SN, the sequence number of the packet. Step S51 sets bit n in the array and stores the packet.

Step S52 increments the counters of all FEC packets linked to the array index n. In response to step S52 and to the recovery step S29, step S53 examines each FEC packet linked to array index n. If the value of the counter is equal to the number of bits in the mask minus 1, step S53 then uses the FEC packet to recover the packet n. If a packet is recovered, step S55 decrements the history. The procedure then stops at step S57.

The just-described checking procedure is a highly efficient method of counting, for each FEC packet, the number of array entries associated with that FEC packet that are also associated with a particular media packet.

According to the invention, in FIG. 1, the arrangement of the steps of the method cooperating with recovery Step S29 are the key to enabling the receiver to correct errors in media packets even when the forward error-correcting code algorithm sent from the transmitter is changed without notice. Recovery step S29 requires two distinct operations. The first step, which is executed by the flow chart as a whole, determines which media and FEC packets must be combined in order to recover a missing packet. The second step, which is step S29 itself, actually reconstructs the data. The second step must be performed as described below. Different algorithms for the first step result in tradeoffs between complexity and the ability to recover missing packets. The algorithm of FIG. 1, which is the algorithm of the present invention, has proved to be highly advantageous.

Reconstructing the data (Step S29) uses the following steps, wherein T is the list of FEC and media packets that should be combined to recover a media packet xi. In brief the packet xi is recovered by applying the inverse of f0 to the other received packets in T. The procedure is as follows:

1. For the media packets in T, compute the binary array as described in the previous section.
2. For the FEC packets in T, compute the binary array in the same fashion, except always set the CSRC list, extension and padding to null.
3. If the resulting binary arrays are not of equal length, pad them with zeroes to be the length of the longest binary array.
4. Apply the f0 inverse operator to the binary arrays, resulting in a recovery array.
5. Create a new packet with the standard 12-byte header and no payload.
6. Set the version of the new packet to 2.
7. Set the Padding Bit in the new packet to the first bit in the recovery array.
8. Set the Extension Bit in the new packet to the second bit in the recovery array.
9. Set the CC field to the next three bits in the recovery array.

10. Set the marker bit in the new packet to the next bit in the recovery array.
11. Set the payload type in the new packet to the next 7 bits in the recovery array.
12. Set the SN field in the new packet to xi.
13. Set the most significant 24 bits of the timestamp in the new package to the most significant 24 bits of a nearby packet, preferably the previous packet and set the least significant 8 bits of the timestamp to the next 8 bits in the array. If the difference in timestamps between the new packet and the previous, or a previous, packet is negative, there was a rollover. Increment the most significant 24 bits in the timestamp of the new packet.
14. Determine what natural binary number corresponds to the next 16 bits of the recovery array and append that many bytes of the recovery array to the new packet, to represent the CSRC list, extension, payload, and padding.
15. Set the SSRC of the new packet to the SSRC of the media stream being protected by the new packet.

When all packets needed to recover a media packet are available, the preceding procedure will completely recover both the header and payload of the media packet with high probability. Any uncertainty relates to the timestamp value when large timestamp increments are present.

EXAMPLE

Consider 2 media packets to be sent, x and y. We wish to protect them by sending one FEC packet which is derived from x and y. The f operator is implemented using xor. The three packets are:
Media Packet x
  Version: 2 (10)
  Padding: 0 (0)
  Extension: 0 (0)
  Marker: 0 (0)
  PTI: 11 (01011)
  SN: 8 (1000)
  TS: 3 (011)
  SSRC: 2 (10)
  The payload length is 10 bytes.
Media Packet y
  Version: 2 (10)
  Padding: 0 (0)
  Extension: 0 (0)
  Marker: 1 (1)
  PTI: 18 (10010)
  SN: 9 (1001)
  TS: 5 (101)
  SSRC: 2 (10)
  The payload length is 11 bytes.
The FEC Packet (contains a xor b) is then:
  Version: 2 (10)
  Padding: 0 (0)
  Extension: 0 (0)
  Marker: 1 (1) (NOTE: 0 xor 1=1)
  PTI: 191 (NOTE: Assume PTI 191 implies xor FEC)
  SN: 1
  S: 3
  SSRC: 2 (10)
  len. rec.: 1 (1) (NOTE: 10 xor 11=1010 xor 1011=0001)
  PTI rec.: 24 (11001)
  SN base: 8
  TS rec.: 6 (110) (3 xor 5=6)
  E: 0 (0)
  mask: 3 (0000000000000011)
  The payload length is 11 bytes.

One can consider an FEC packet as a redundant coding of the media. Because of this, the payload format for encoding of redundant audio data can be used to carry the FEC data along with the media. The procedure for this is simple. In some media packet, the payload type is set to the value for redundant encodings. The secondary coder is then set to be the FEC data. This means that the PTI of the secondary coder is set to the PTI value that indicates FEC. The block length of the secondary coder is set to the length of the FEC header and payload. The timestamp offset is set to the difference between the media timestamp and the timestamp from the FEC packet. The secondary coder payload includes the FEC header and FEC payload.

This procedure only works if an FEC packet is sent after at least one of the media packets it is associated with has been sent. Otherwise, the timestamp offset would be negative, which is not allowed.

Using the redundant encodings payload format also implies that the marker bit cannot be recovered. An advantage of this approach is a reduction in the overhead for sending FEC packets. A known example of redundant encodings payload format can be found in Perkins et al., *RTP Payload for Redundant Audio Data, Network Working Group, Request for Comments (RFC)* 2198, Category: Standards Track, at ftp://ftp.isi.edu/in-notes/rfc2198.txt.

Figure 2:
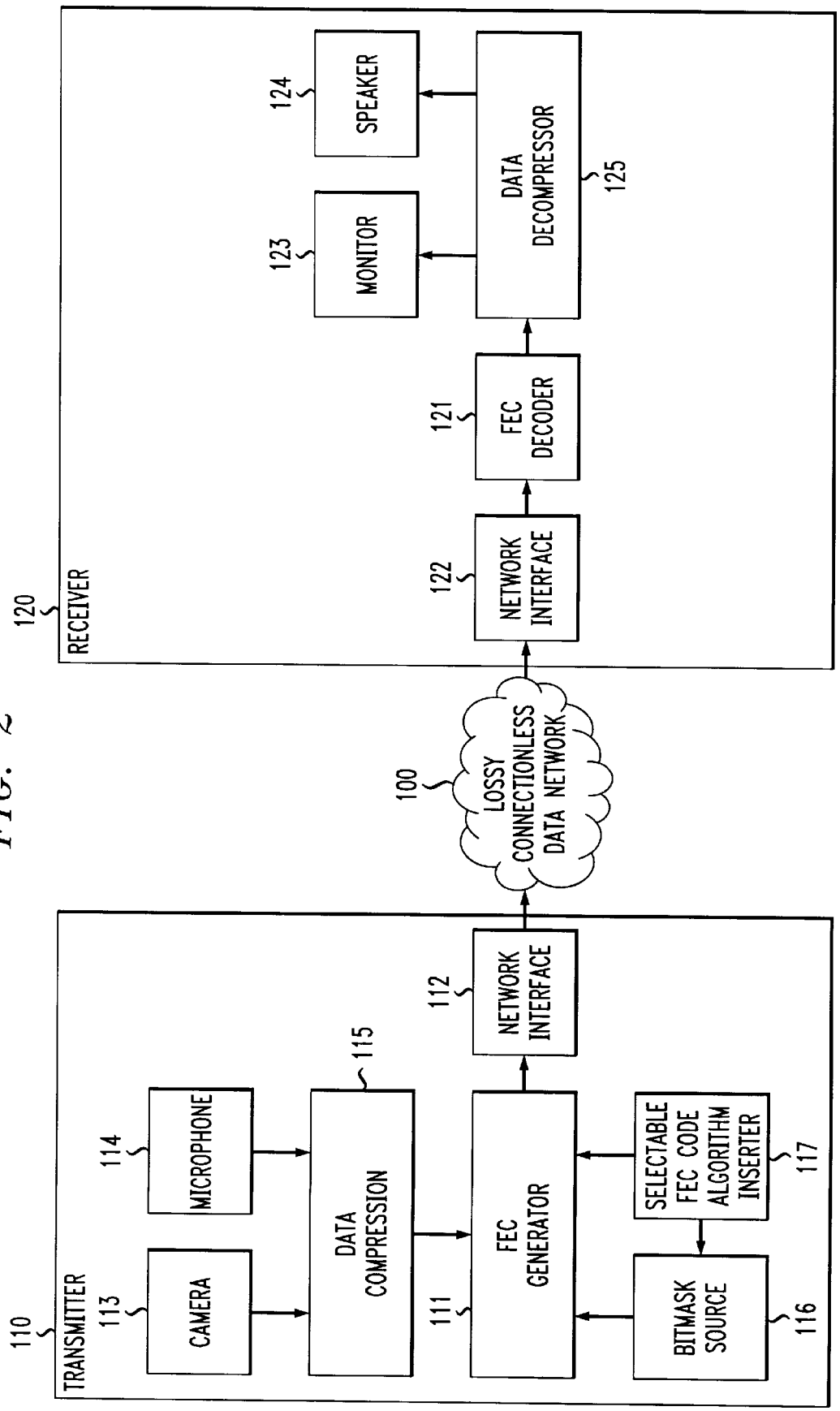
FIG. 2 shows a block-diagrammatic illustration of a preferred implementation of apparatus using the invention.

FIG. 2 shows an illustrative transmission system for implementing the method of the invention. Transmitter 110 is separated from FEC-capable receiver 120 by the occasionally lossy connectionless data network 100. In transmitter 110, the forward-error-correcting code generator 111 is coupled through network interface 112 to the network 100. The data packets to be transmitted are derived from camera 113 and microphone 114. Their signals are sent through data compression circuit 115 so that compressed versions of the signals arrive at FEC generator 111. Bitmask source 116 indicates to FEC generator 111 those media packets that should be covered by FEC. Selectable FEC code algorithm inserter 117 inserts the operator's choice for forward error correction.

Selectable FEC code algorithm inserter 117 comprises either a hard-wired logic apparatus or a programmed central processing unit for inserting the selected algorithm into a payload type header of each FEC packet.

Bitmask source 116 comprises either a hard-wired logic apparatus or a programmed central processing unit, in either case, illustratively under control of the algorithm inserter 117, for associating a forward-error-correcting packet with a plurality of media packets.

In receiver 120, FEC decoder 121 receives the media packet streams and the FEC packet streams from the network 100 through network interface 122. The decoded media are decompressed in data decompressor 125 and are sent to monitor 123 and speaker 124, as appropriate.

FEC decoder 121 performs the method of FIG. 1 and is implemented accordingly. It is noteworthy that transmitter 110 may differ from prior transmitters capable of transmitting FEC packets primarily only in the use of bitmask source 116 and selectable FEC code algorithm inserter 117.

If the packet streams are received at some receivers (not shown) that are not FEC-capable, they can continue to operate with uncorrected errors by simply ignoring FEC packets.

What is claimed is:

1. A method for applying forward error correction to media packets in a transmission network, comprising the steps of choosing an error correcting code at a transmitter;

generating a set of FEC packets, each FEC packet containing an offset bitmask associating the FEC packet with a media packet and containing a field sufficient to impart the chosen error-correcting code to at least one FEC-capable receiver;

sending the packet stream, consisting of media packets and FEC packets, to the FEC-capable receiver; and decoding the packet stream at the FEC-capable receiver, generating media packets as a result.

2. The method according to claim 1, wherein the step of generating the set of FEC packets includes the step of generating an FEC packet header, including the steps of:

generating a sequence number base;

generating the offset bit mask with data of offsets from said sequence number base indicating which media packets are associated with said FEC packet.

3. The method according to claim 2, wherein the step of generating the sequence number base comprises the steps of:

computing the minimum sequence number of all media packets associated with said FEC packet; and setting said sequence number base to said minimum sequence number.

4. The method according to claim 3, wherein the step of generating the offset bitmask comprises the step of:

setting bit I in said bitmask if the media packet with sequence number K+I is associated with said FEC packet, the value of K being equal to said sequence number base.

5. The method according to claim 1, wherein the step of decoding comprises the steps of:

receiving a media packet;

linking each FEC packet received with those media packets associated with it;

checking whether sufficient media packets have been received to allow an FEC packet to be used to recover a missing media packet;

recovering said missing media packet should such checking succeed.

6. The method according to claim 5, wherein the step of linking comprises the steps of:

constructing an array;

setting the Kth entry of said array to point to said FEC packet if said FEC is associated with media packet with sequence number K;

further setting the Kth entry of said array to point to said media packet if said media packet is received, otherwise further setting said array to point to an empty object.

7. The method according to claim 6, wherein the step of linking further comprises the steps of:

associating a number with said FEC packet, said number having a value equal to the number of media packets that have been received that are associated with said FEC packet;

incrementing said number when another media packet is received that is associated with said FEC packet.

8. The method according to claim 6, wherein the step of checking further comprises the steps of:

associating array entry K with a received media packet, where K is also the sequence number of the received media packet;

traversing a list of FEC packets pointed to by array entry K;

for each FEC packet, counting the number of array entries associated with said FEC packet, which array entries are also associated with a media packet;

declaring said check to succeed if said counted number of array entries is equal to the number of array entries associated with said FEC packet, minus one.

9. The method of claim 7, wherein the step of checking further comprises the steps of:

associating array entry K with said media packet, where K is also the sequence number of said media packet as received;

traversing a list of FEC packets pointed to by array entry K;

for each FEC packet, increasing said number associated with said FEC packet by one;

declaring said check to succeed for any FEC packet if a count of said list is equal to said number of array entries associated with said FEC packet, minus one.

10. The method of claim 5, wherein the step of recovering further comprises the step of performing the exclusive or of the content of those media packets associated with said FEC packet, which media packets have been received with content of said FEC packet.

11. Apparatus for providing forward error correction in a transmission network for data packets transmitted therein, comprising:

apparatus for providing media data packets for transmission;

a transmission interface with the network;

a forward-error-correcting code generator for preparing the media data packets and separable forward-error-correcting packets for transmission through said transmission interface into said network, said forward-error-correcting code generator being capable of operating with a plurality of algorithms for forward error corrections;

an algorithm inserter for inserting one of the plurality of algorithms into said forward-error-correcting code generator;

a bitmask source for providing to said forward-error-correcting code generator an offset bitmask for insertion in the protocol header, the offset bitmask associating a forward-error-correction packet with at least one media packet;

a reception interface with said network; and apparatus for providing an error-corrected version of the media data packets received from the network through the reception interface, including a decoder capable of acquiring and using any of a plurality of algorithms for forward-error-correction received through the interface from the network.

12. Apparatus according to claim 11, wherein the algorithm inserter comprises a first logic apparatus for inserting the one algorithm into a payload type header of each FEC packet.

13. Apparatus according to claim 12, wherein the bitmask source comprises a second logic apparatus controllable by the first logic apparatus for associating the forward-error-correcting packet with the at least one media packet.

* * * * *